(12) United States Patent
Schuetz et al.

(10) Patent No.: US 10,021,802 B2
(45) Date of Patent: Jul. 10, 2018

(54) ELECTRONIC MODULE ASSEMBLY HAVING LOW LOOP INDUCTANCE

(71) Applicant: General Electric Company, Schenectady, NY (US)

(72) Inventors: Tobias Schuetz, Munich (DE); Philip Michael Cioffi, Schaghticoke, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 11 days.

(21) Appl. No.: 15/268,653

(22) Filed: Sep. 19, 2016

(65) Prior Publication Data

US 2018/0084661 A1 Mar. 22, 2018

(51) Int. Cl.
*H05K 7/00* (2006.01)
*H05K 7/02* (2006.01)
(Continued)

(52) U.S. Cl.
CPC .......... *H05K 7/026* (2013.01); *H01L 23/485* (2013.01); *H01L 24/49* (2013.01); *H01L 25/071* (2013.01); *H02B 1/205* (2013.01); *H02M 7/003* (2013.01)

(58) Field of Classification Search
CPC ................................ H05K 7/026; H02B 1/205
(Continued)

(56) References Cited

U.S. PATENT DOCUMENTS

| 5,388,028 | A | 2/1995 | Arbanas |
| 7,791,208 | B2 * | 9/2010 | Bayerer ............... H01L 24/48 257/773 |

(Continued)

FOREIGN PATENT DOCUMENTS

| CN | 101222173 B | 6/2010 |
| EP | 1 160 866 A2 | 12/2001 |

(Continued)

OTHER PUBLICATIONS

Lounis Z et al., "Minimization of wiring inductance in high power IGBT inverter", Power Delivery, IEEE Transactions on, vol. 15, Issue: 2, Apr. 2000,pp. 551-555.

(Continued)

*Primary Examiner* — Hung S Bui
(74) *Attorney, Agent, or Firm* — GE Global Patent Operation; John Darling

(57) ABSTRACT

An electronic module is presented. The electronic module includes one or more electronic devices and a first bus electrically coupled to at least one of the one or more electronic devices. The first bus includes a first electrically conductive plate, a second electrically conductive plate, and a first electrically insulating plate disposed between the first electrically conductive plate and the second electrically conductive plate, where in a first portion of the first bus, the first electrically insulating plate is disposed such that the first electrically insulating plate is not in direct physical contact with at least one of the first electrically conductive plate and the second electrically conductive plate to form at least one cavity between the first electrically insulating plate and at least one of the first electrically conductive plate and the second electrically conductive plate. An electronic module assembly having low loop inductance is also presented.

20 Claims, 10 Drawing Sheets

(51) Int. Cl.
  *H02B 1/20* (2006.01)
  *H01L 23/485* (2006.01)
  *H01L 23/00* (2006.01)
  *H01L 25/07* (2006.01)
  *H02M 7/00* (2006.01)

(58) Field of Classification Search
  USPC .......................................................... 361/729
  See application file for complete search history.

(56) References Cited

U.S. PATENT DOCUMENTS

| | | | |
|---|---|---|---|
| 8,432,694 B2 | 4/2013 | Hentschel et al. | |
| 8,436,244 B2 | 5/2013 | Takahashi | |
| 8,599,556 B2 | 12/2013 | Hentschel et al. | |
| 8,897,014 B2 | 11/2014 | Wagoner et al. | |
| 8,952,525 B2 | 2/2015 | Ide et al. | |
| 9,620,292 B2* | 4/2017 | Wen | H01G 4/38 |
| 2002/0186543 A1* | 12/2002 | Gobl | H01L 24/49 361/719 |
| 2004/0056349 A1 | 3/2004 | Yamada et al. | |
| 2013/0111098 A1* | 5/2013 | Li | G06F 1/188 710/305 |
| 2017/0025806 A1* | 1/2017 | Bittner | H01R 13/621 |

FOREIGN PATENT DOCUMENTS

| | | |
|---|---|---|
| EP | 1 788 596 A1 | 5/2007 |
| EP | 2 317 551 A1 | 5/2011 |
| EP | 2 555 406 A1 | 2/2013 |
| JP | 2014-093421 A | 5/2014 |
| WO | 2013179433 A1 | 12/2013 |

OTHER PUBLICATIONS

Frisch M et al., "Power module with additional low inductive current path", Integrated Power Electronics Systems (CIPS), 2010 6th International Conference on, Mar. 16-18, 2010, pp. 1-6.
Borghoff, "Implementation of low inductive strip line concept for symmetric switching in a new high power module", PCIM Europe 2013, May 14-16, 2013, 7 Pages.
International Search Report and Written Opinion issued in connection with corresponding PCT Application No. PCT/US2017/48432 dated Nov. 8, 2017.

* cited by examiner

ELECTRONIC MODULE ASSEMBLY HAVING LOW LOOP INDUCTANCE

BACKGROUND

Embodiments of the present specification relate to an electronic module, and more particularly to an enhanced design of an electronic module assembly having low loop inductance.

The advent of new semiconductor materials such as silicon carbide (SiC) for use in semiconductor switches allows the semiconductor switches to be operated at increased switching speeds as well as increased power and voltage levels in comparison to semiconductor switches formed using silicon, germanium, gallium arsenide, gallium phosphide, and cadmium sulphide. Advantageously, use of such semiconductor switches allows creation of higher efficiency power converters. Such semiconductor switches that are operable at higher switching speeds call for an improved way of interconnecting the semiconductor switches with other components in a power converter.

In addition, an inductance of such an interconnection plays an important role in the optimal operation of the power converters. High inductance associated with the interconnection may result in high voltage overshoots, oscillations in output currents and voltages, and other unwanted switching behaviors.

Moreover, it is desirable to provide suitable insulation between certain current carrying paths in the power converter to allow operation of the power converter at high voltages. Typically, currently available power converters are manufactured such that a power converter module's internal inductance has a small value. Similarly, other converter components such as direct-current (DC) link busbars are manufactured such that these components also satisfy/maintain high creepage distance and insulation standards while still having a low inductance value.

In the currently available power converters, current carrying sheets of electrically conductive material with positive potential and negative potential are positioned as close together as possible in a bus to achieve low inductance. Positioning these sheets of electrically conductive material close together results in a significant decrease in room for a magnetic field that may result in an increase in the inductance. However, there exists a challenge to position these sheets of electrically conductive material close together at the interconnection of two buses while still ensuring proper insulation of the two potentials. Moreover, as will be appreciated, the inductances of the power converter module, the DC-link busbar, and the connection between the power converter module and the DC-link busbar form a loop inductance. It is also desirable to maintain this loop inductance at a low value.

BRIEF DESCRIPTION

In accordance with aspects of the present specification, an electronic module is presented. The electronic module includes one or more electronic devices. The electronic module further includes a first bus electrically coupled to at least one of the one or more electronic devices, where the first bus includes a first electrically conductive plate, a second electrically conductive plate, and a first electrically insulating plate disposed between the first electrically conductive plate and the second electrically conductive plate, where in a first portion of the first bus, the first electrically insulating plate is disposed such that the first electrically insulating plate is not in direct physical contact with at least one of the first electrically conductive plate and the second electrically conductive plate to form at least one cavity between the first electrically insulating plate and at least one of the first electrically conductive plate and the second electrically conductive plate.

In accordance with aspects of the present specification, an electronic module assembly is presented. The electronic module assembly includes a first electronic module including one or more first electronic devices, a first bus electrically coupled to at least one of the one or more first electronic devices and including a first electrically conductive plate, a second electrically conductive plate, and a first electrically insulating plate disposed between the first electrically conductive plate and the second electrically conductive plate, where in a first portion of the first bus, the first electrically insulating plate is disposed such that the first electrically insulating plate is not in direct physical contact with at least one of the first electrically conductive plate and the second electrically conductive plate to form at least one cavity between the first electrically insulating plate and at least one of the first electrically conductive plate and the second electrically conductive plate. The electronic module assembly further includes a second electronic module including one or more second electronic devices, a second bus electrically coupled to at least one of the one or more second electronic devices and including a third electrically conductive plate, a fourth electrically conductive plate, and a second electrically insulating plate disposed between the third electrically conductive plate and the fourth electrically conductive plate. The first electronic module is electrically coupled to the second electronic module such that a portion of the second bus is disposed in the at least one cavity in the first portion of the first bus.

In accordance with aspects of the present specification, a method for manufacturing an electronic module assembly is presented. The method includes providing a first electronic module, where the first electronic module includes one or more electronic devices and a first bus electrically coupled to at least one of the one or more electronic devices, where the first bus includes a first electrically conductive plate, a second electrically conductive plate, and a first electrically insulating plate disposed between the first electrically conductive plate and the second electrically conductive plate, where in a first portion of the first bus, the first electrically insulating plate is disposed such that the first electrically insulating plate is not in direct physical contact with at least one of the first electrically conductive plate and the second electrically conductive plate to form at least one cavity between the first electrically insulating plate and at least one of the first electrically conductive plate and the second electrically conductive plate. The method further includes providing a second electronic module, where the second electronic module includes one or more second electronic devices, and a second bus electrically coupled to at least one of the one or more second electronic devices, a third electrically conductive plate, a fourth electrically conductive plate, and a second electrically insulating plate disposed between the third electrically conductive plate and the fourth electrically conductive plate. Moreover, the method also includes operatively coupling the first electronic module with the second electronic module such that a portion of the second bus is disposed in the at least one cavity in the first portion of the first bus to form the electronic module assembly.

DRAWINGS

These and other features, aspects, and advantages of the present specification will become better understood when the following detailed description is read with reference to the accompanying drawings in which like characters represent like parts throughout the drawings, wherein.

DETAILED DESCRIPTION

In the following specification and the claims, the singular forms "a", "an" and "the" include plural referents unless the context clearly dictates otherwise. As used herein, the term "or" is not meant to be exclusive and refers to at least one of the referenced components being present and includes instances in which a combination of the referenced components may be present, unless the context clearly dictates otherwise.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances, the modified term may sometimes not be appropriate, capable, or suitable.

Figure 1:
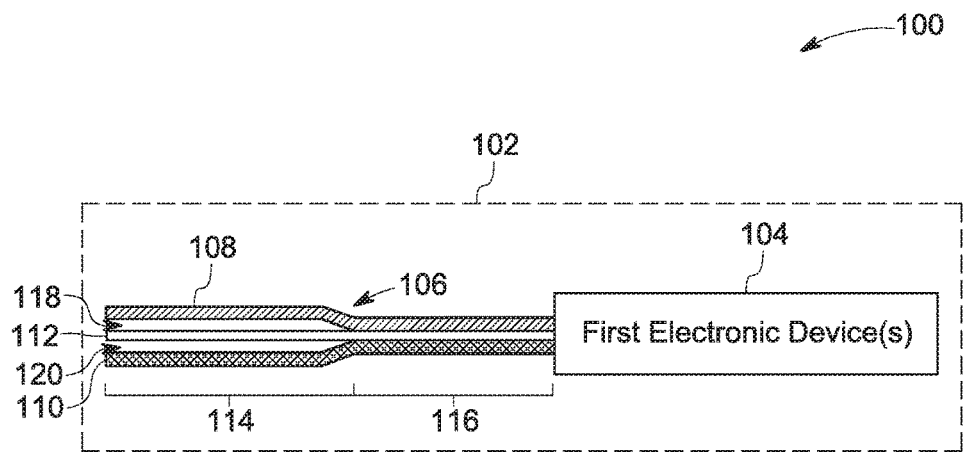
FIG. 1 is a diagrammatic representation of an electronic module, in accordance with aspects of the present specification.

FIG. 1 is a diagrammatic representation 100 of an electronic module 102, in accordance with aspects of the present specification. This electronic module 102 may be generally referred to as a first electronic module 102. More particularly, in FIG. 1, a cross-sectional view of the first electronic module 102 is depicted. Non-limiting examples of the first electronic module 102 include a semiconductor switching unit including one or more semiconductor switches, a power supply unit having a capacitor, or a combination thereof.

In some embodiments, the first electronic module 102 may include one or more first electronic devices 104 and a first bus 106 electrically coupled to at least one of the first electronic devices 104. By way of example, the first electronic devices 104 may include one or more semiconductor switches, one or more capacitors, one or more batteries, or combinations thereof. In one embodiment, the semiconductor switches include an insulated gate bipolar transistor, a metal oxide semiconductor field effect transistor, a field-effect transistor, an injection enhanced gate transistor, an integrated gate commutated thyristor, or combinations thereof. Moreover, these semiconductor switches may include any type of suitable semiconductor based switch, such as, but not limited to, a gallium nitride based switch, a silicon carbide based switch, a gallium arsenide based switch, or combinations thereof. Also, in one example, the first bus 106 may be a direct-current (DC) bus configured to aid in the flow of direct current to and/or from the first electronic devices 104.

Also, in accordance with aspects of the present specification, the first bus 106 may include a first electrically conductive plate 108 and a second electrically conductive plate 110. In certain embodiments, the first electrically conductive plate 108 and/or the second electrically conductive plate 110 may include electrically conductive materials such as, but not limited to, copper (Cu), aluminum (Al), gold (Au), silver (Ag), or combinations thereof. Further, in a non-limiting example, the first electrically conductive plate 108 and/or second electrically conductive plate 110 may have a rectangular shape.

Moreover, the first electrically conductive plate 108 and the second electrically conductive plate 110 may be maintained at different electric potentials. More particularly, while the first electrically conductive plate 108 is maintained at a first potential, the second electrically conductive plate 110 is maintained at a second potential, where the second potential is different from the first potential. In a non-limiting example, the first potential is a positive potential and the second potential is a negative potential. Alternatively, the first potential may have a negative value, while the second potential has a positive value.

In addition, in some embodiments, the first bus 106 may also include a first electrically insulating plate 112. As depicted in FIG. 1, the first electrically insulating plate 112 may be disposed between the first electrically conductive plate 108 and the second electrically conductive plate 110. Example materials of the first electrically insulating plate 112 may include electrically insulating materials such as, but not limited to, formex, glastic, glass fiber compounds, polyethylene terephthalate (PET), or polytetrafluoroethylene (PTFE), or combinations thereof. Further, in a non-limiting example, the first electrically insulating plate 112 may have a rectangular shape.

For ease of explanation, the first bus 106 is described as having two portions—a first portion 114 and a second portion 116. In the first portion 114 of the first bus 106, the first electrically insulating plate 112 may be disposed in an arrangement such that the first electrically insulating plate 112 is not in direct physical contact with at least one of the first electrically conductive plate 108 and the second electrically conductive plate 110. In the example of FIG. 1, in the first portion 114, the first electrically insulating plate 112 is not in direct physical contact with both the first electrically conductive plate 108 and the second electrically conductive plate 110. Arranging the electrically insulating plate 112 and the first and second electrically conductive plates 108, 110 as depicted in FIG. 1 results in two cavities 118 and 120 in the first portion 114 of the first bus 106. A first cavity 118 is formed between the first electrically conductive plate 108 and the first electrically insulating plate 112. Also, a second cavity 120 is formed between the second electrically conductive plate 110 and the first electrically insulating plate 112. Although, the embodiment of FIG. 1 depicts the first portion 114 as having two cavities 118, 120, a first bus with a first portion having a single cavity is also envisioned (see FIG. 5). In some embodiments, the cavities 118, 120 facilitate operatively coupling the first electronic module 102 to another electronic module (see FIG. 3).

Moreover, it may be noted that in some embodiments, in the second portion 116 of the first bus 106, the first electrically insulating plate 112 may be disposed such that there is no direct physical contact between the first electrically insulating plate 112 and the first and second electrically conductive plates 108, 110.

Furthermore, in certain embodiments, in the second portion 116 of the first bus 106, the first electrically insulating plate 112 is disposed in direct physical contact with at least one of the first electrically conductive plate 108 and second electrically conductive plate 110. In the example of FIG. 1, the first electrically insulating plate 112 is shown as being disposed in direct physical contact with the second electrically conductive plate 110 in the second portion 116 of the first bus 106. Disposing the first electrically insulating plate 112 in direct physical contact with the electrically conductive plates 108, 110 aids in reducing inductance of the second portion 116 of the first bus 106. More particularly, positioning the first electrically conductive plate 108 in close proximity with the second electrically conductive plate 110 facilitates reduction in the inductance of the second portion 116 off the first bus 106. This arrangement of the first electrically insulating plate 112 and the first and second electrically conductive plates 108, 110 in the second portion 116 of the first bus 106 facilitates creation of the first electronic module 102 having low inductance.

As noted hereinabove, the first portion 114 of the first bus 106 includes at least one cavity such as the cavities 118, 218. Presence of these cavities may result in a higher inductance of the first portion 114 in comparison to the lower inductance of the second portion 116 of the first bus 106. Advantageously, the exemplary arrangement of the first electronic module 102, and in particular the cavities 118, 120 in the first portion 114 facilitate operatively coupling the first electronic module 102 with another electronic module (see FIG. 2) to create an electronic module assembly (see FIG. 3) having an overall lower loop inductance in comparison with currently available electronic modules. The term "loop inductance" of the electronic assembly as used herein refers to a sum of inductances of the electronic modules of the electronic module assembly and an inductance of an interconnection of the electronic modules.

Figure 2:
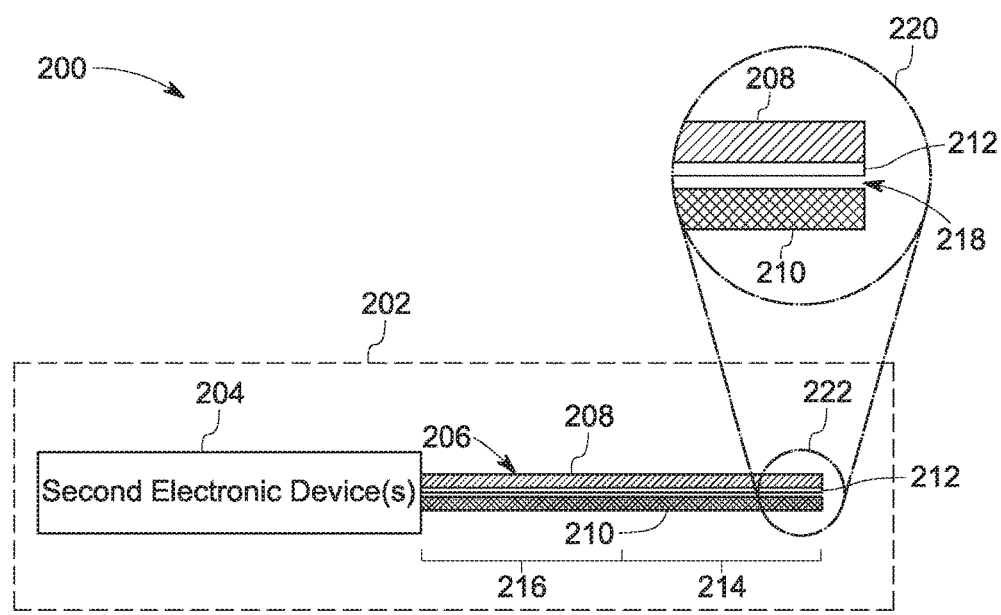
FIG. 2 is a diagrammatic representation of another electronic module, in accordance with aspects of the present specification.
Figure 3:
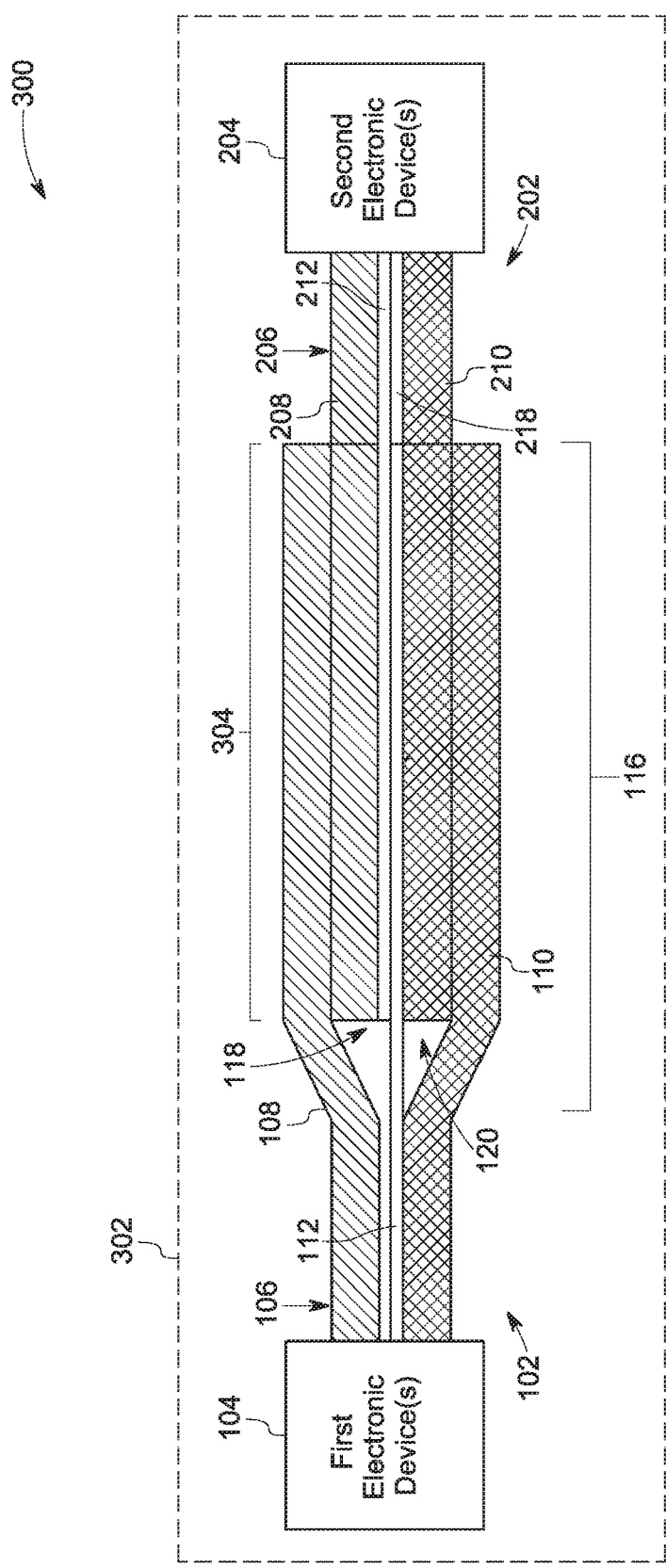
FIG. 3 is a diagrammatic representation of an electronic module assembly formed by coupling the electronic modules of FIGS. 1 and 2, in accordance with aspects of the present specification.

The lower loop inductance of the electronic module assembly is achieved at least in part by interconnecting the first electronic module 102 of FIG. 1 and another electronic module (see FIG. 2) such that at least a portion of a bus of the other electronic module is disposed in the cavities 118, 120 (see FIG. 3). More particularly, operatively coupling the first electronic module 102 and another electronic module via the cavities 118 and 120 aids in reducing an inductance of an interconnection between the first electronic module 102 and the other electronic module. This reduction in the inductance of the interconnection between the first electronic module 102 and another electronic module in turn reduces the overall loop inductance of the electronic module assembly.

FIG. 2 is a diagrammatic representation 200 of another embodiment 202 of an electronic module. This embodiment of the electronic module may generally be referred to as a second electronic module 202. More particularly, in FIG. 2, a cross-sectional view of the second electronic module 202 is depicted. Non-limiting examples of the second electronic module 202 include a semiconductor switching unit including one or more semiconductor switches, a power supply unit having a capacitor, or a combination thereof. In some embodiments, the second electronic module 202 may include one or more second electronic devices 204 and a second bus 206 electrically coupled to at least one of the second electronic devices 204. In one example, the one or more second electronic devices 204 may include one or more semiconductor switches, one or more capacitors, one or more batteries, or combinations thereof. In certain embodiments, the semiconductor switches include an insulated gate bipolar transistor, a metal oxide semiconductor field effect transistor, a field-effect transistor, an injection enhanced gate transistor, an integrated gate commutated thyristor, or combinations thereof. Further, the semiconductor switches may include any type of suitable semiconductor based switch, such as, but not limited to, a gallium nitride based switch, a silicon carbide based switch, a gallium arsenide based switch, or combinations thereof. Furthermore, the second bus 206 may be a DC bus configured to aid in the flow of direct current to and/or from the second electronic devices 204.

In some embodiments, the second bus 206 includes a third electrically conductive 208 plate, a fourth electrically conductive plate 210, and a second electrically insulating plate 212. Moreover, in a presently contemplated configuration, the second electrically insulating plate 212 is disposed between the third electrically conductive plate 208 and the fourth electrically conductive plate 210. In particular, at least along some portion of the second bus 206, the second electrically insulating plate 212 may be disposed in direct physical contact with one of the third electrically conductive plate 208 and the fourth electrically conductive plate 210. In the example of FIG. 2, as depicted in an enlarged view 220 of a region 222 of the bus 206, the second electrically insulating plate 212 is shown as being in direct physical contact with the third electrically conductive plate 208. Also, there exists a cavity 218 between the second electrically insulating plate 212 and the fourth electrically conductive plate 210.

In accordance with further aspects of the present specification, the configuration of the second bus 206 is different from that of the first bus 106 of FIG. 1. More particularly, in the embodiment of FIG. 2, the second electrically insulating plate 212 is in direct physical contact with the third electrically insulating plate 208 along the entire length of the second bus 206. In some other embodiments, the second electrically insulating plate 212 may be disposed in direct physical contact with the third electrically insulating plate 208 along at least a determined portion of the length of the second bus 206.

Moreover, in some embodiments, the second bus 206 may include two portions—a first portion 214 and a second portion 216. In the embodiment of FIG. 2, the configuration of the second bus 206 in the first portion 214 and the second portion 216 are similar. It may be noted that in other embodiments of the second bus 206, the configurations of the second bus 206 in the first portion 214 and second portion 216 may be different (see FIG. 6). By way of example, in the second portion 216, the second electrically insulating plate 212 may be disposed in direct physical contact with both the third electrically conductive plate 208 and the fourth electrically conductive plate 210. This arrangement of the electrically conductive plates 208, 210 and the second electrically insulating plate 212 aids depicted in FIG. 2 aids in reducing an inductance of the second portion 216 of the second bus 206, thereby facilitating creation of the second electronic module 102 having low inductance.

Although, in FIGS. 1 and 2, for ease of illustration, the buses 106 and 206 are shown as including two electrically conductive plates, other embodiments of the buses 106 and 206 having multiple electrically conductive plates/layers are also envisioned. In such a configuration, adjacently disposed electrically conductive plates may be insulated from one another via additional electrically insulating plates.

Moreover, it may be noted that the arrangements of the first and second electronic modules 102, 202 of FIGS. 1 and 2 may result in electronic modules configurations that individually have inadequate electrical insulation between the respective electrically conductive plates, more particularly, in the first portions 114 and 214 of the first and second buses 106, 206. For example, in some embodiments, in FIG. 1, in the first portion 114 of the first bus 106, the first electrically insulating plate 112 is selected such that a length of the first electrically insulating plate 112 is lesser than or equal to a length of at least one of the first electrically conductive plate 108 and the second electrically conductive plate 110. These dimensions of the first electrically insulating plate 112 and the first and second electrically conductive plates 108 and 110 result in inadequate electrical insulation between the first and second electrically conductive plates 108 and 110. Similarly, in the embodiment of FIG. 2, in the first portion 214, the second electrically insulating plate 212 is selected such that a length of the second electrically insulating plate 212 is lesser than or equal to a length of at least one of the third and fourth electrically conductive plates 208, 210. These dimensions of the second electrically insulating plate 212 and the third and fourth electrically conductive plates 208, 210 result in inadequate electrical insulation between the third and fourth electrically conductive plates 208, 210 in the first portion 214.

In certain instances, it may be desirable to operatively couple the first and second electronic modules 102, 202 to form an electronic module assembly. By way of example, the first electronic module 102 may be a power converter module such as an inverter switching unit having semiconductor switches and the second electronic module 202 may be a DC power supply unit having a capacitor to form a DC bus. The first and second electronic modules 102, 202 may be coupled to each other via their respective buses 106, 206. It may be noted that although each of the first and second electronic modules 102, 202 may not individually have the lowest possible inductance values, the exemplary configurations of each electronic module 102, 202 facilitate the coupling of the electronic modules 102, 202 to form an electronic module assembly (see FIG. 3) having an overall lower value of loop inductance and desired/desirable electrical insulation between the electrically conductive plates 108, 208 and the electrically conductive plates 110, 210. More specifically, the first and second electronic modules 102, 202 are assembled such that the two corresponding electrically insulating plates 112, 212 are combined to form a single electrically insulating medium in the electronic module assembly. In the resulting exemplary electronic module assembly, the electrically conductive plates 108, 208 are electrically insulated from the electrically conductive plates 110, 210 via the electrically insulating plates 112, 212. Also, the resulting electronic module assembly has a lower overall loop inductance in comparison to the currently available assemblies that in general employ fasteners such as screws passing through one or more electrically conductive plates. Consequently, the electronic module assembly having the lower overall loop inductance may find application with new materials such as silicon carbide (SiC).

Turning now to FIG. 3, a diagrammatic representation 300 of an electronic module assembly 302, in accordance with aspects of the present specification, is presented. More particularly, the electronic module assembly 302 is formed by assembling the first electronic module 102 of FIG. 1 and the second electronic module 202 of FIG. 2. Accordingly, the electronic module assembly 302 is described with reference to the components of FIGS. 1-2.

As noted hereinabove, the electronic module assembly 302 includes the first electronic module 102 and the second electronic module 202 electrically coupled to each other. In particular, in the electronic module assembly 302 of FIG. 3, the first portion 114 of the first bus 106 is operatively coupled to the first portion 214 of the second bus 206 of the second electronic module 202. More specifically, as depicted in the exemplary embodiment of FIG. 3, the first and second electronic modules 102, 202 are operatively coupled such that a portion of the second bus 206 is disposed between the first electrically conductive plate 108 and the second electrically conductive plate 110 of the first electronic module 102. In particular, the portion of the second bus 206 may be disposed in the cavities 118, 120 in the first portion 114 of the first bus 106 such that the second electrically insulating plate 212 overlaps the first electrically insulating plate 112. As noted hereinabove, in some embodiments, the portion of the second bus 206 is disposed in the cavities 118, 120 in the first portion 114 of the first bus 106. Additionally, the first electrically insulating plate 112 may be inserted in the cavity 218 between the second electrically insulating plate 212 and the fourth electrically conductive plate 210. Reference numeral 304 is used to represent the overlap between the first and second electrically insulating plates 112, 212. Moreover, the first electrically conductive plate 108 is electrically coupled to the third electrically conductive plate 208. Additionally, the second electrically conductive plate 110 is electrically coupled to the fourth electrically conductive plate 210.

Furthermore, in an end portion of the first electronic module 102, such as the first portion 114 of the first bus 106, the length of the first electrically insulating plate 112 is lesser than or equal to the length of at least one of the first electrically conductive plate 108 and the second electrically conductive plate 110. Similarly, in the embodiment of FIG. 2, in an end portion of the second electronic module 202, such as the first portion 214 of the second bus 206, the length of the second electrically insulating plate 212 is lesser than or equal to the length of at least one of the third electrically conductive plate 208 and the fourth electrically conductive plate 210. This arrangement results in a reduction in a creepage distance and a strike distance at the respective ends of the first bus 106 and the second bus 206, thereby resulting in inadequate insulation between the respective sets of electrically conductive plates. The term "creepage distance" refers to a shortest distance that an electron has to travel along a surface of an electrically insulating plate such as the electrically insulating plates 112, 212 between two conductive elements such as the electrically conductive plates 108, 110 or the electrically conductive plates 208, 210). The term "strike distance" refers to a shortest distance that an electron has to travel between two conductive plates such as the electrically conductive plates 108, 110, or the electrically conductive plates 208, 210 through air or any other surrounding medium. In accordance with aspects of the present specification, coupling the first and second electronic modules 102 and 202 as depicted in FIG. 3 such that the electrically insulating plates 112, 212 overlap one another, advantageously aids in enhancing the creepage and strike distances corresponding to the overlap region 304. Additionally, the overlapping electrically insulating plates 112, 212 also provide desired electrical insulation between the electrically conductive plates 108, 208 and the electrically conductive plates 110, 210.

It may be noted that the loop inductance of the electronic module assembly 302 may be representative of a sum of inductances of the first and second electronic modules 102, 202 and an inductance of an interconnection represented by the overlap region 304 between of the first and second electronic modules 102, 202. Further, the exemplary arrangements of the first and second electronic modules 102, 202 result in lower values of inductance of the second portions 116 and 216 of the first and second buses 106, 206, which in turn aid in lowering inductances of the first and second electronic modules 102, 202, respectively.

Additionally, the configurations of the first portions 114 and 214 of the first and second buses 106, 206 aids in lowering the inductance of the overlap region 304 of the electronic module assembly 302. Accordingly, it may be desirable to appropriately select the first portions 114 and/or 214 having determined lengths to form the overlap region 304 having a low-inductance. In some embodiments, the lengths of the first portions 114 and/or 214 may be selected such that the overlap region 304 is capable of withstanding maximum current carrying capacity, also referred to as ampacity, of the electronic module assembly 302. In a non-limiting example, in the first portion 114, an area of the first electrically conductive plate 108 and/or the second electrically conductive plate 110 may determine the ampacity of the overlap region 304. Further, in some embodiments, the areas of the electrically conductive plates 108, 110, 208, 210 may be dependent on the lengths of the first portions 114, 214 of the first and second buses 106, 206. In accordance with aspects of the present specification, the first portions 114 and/or 214 having determined lengths are selected such that the overlap region 304 is capable of withstanding the ampacity of the electronic module assembly 302. Selecting the dimensions of the first portion 114 of the first bus 106 and/or the first portion 214 of the second bus 206 as described hereinabove aids in reducing the inductance of an interconnection/coupling between the electronic modules 102, 202. This reduction in the inductance of the interconnection between the electronic modules 102, 202 in turn aids in reducing the loop inductance of the electronic module assembly 302.

Further, it may be noted that the traditional electronic module assemblies employ fasteners such as screws that pass through one or more electrically conductive plates to operatively couple electronic modules. The exemplary electronic module assembly 302 circumvents the need for any such fasteners to operatively couple the electrically conductive plates 108, 208, 110, and 210. Absence of such fasteners that pass through the electrically conductive plates also aids in reducing the inductance of the interconnection between the electronic modules 102, 202, which in turn results in a reduction in the overall loop inductance of the electronic module assembly 302.

Figure 4:
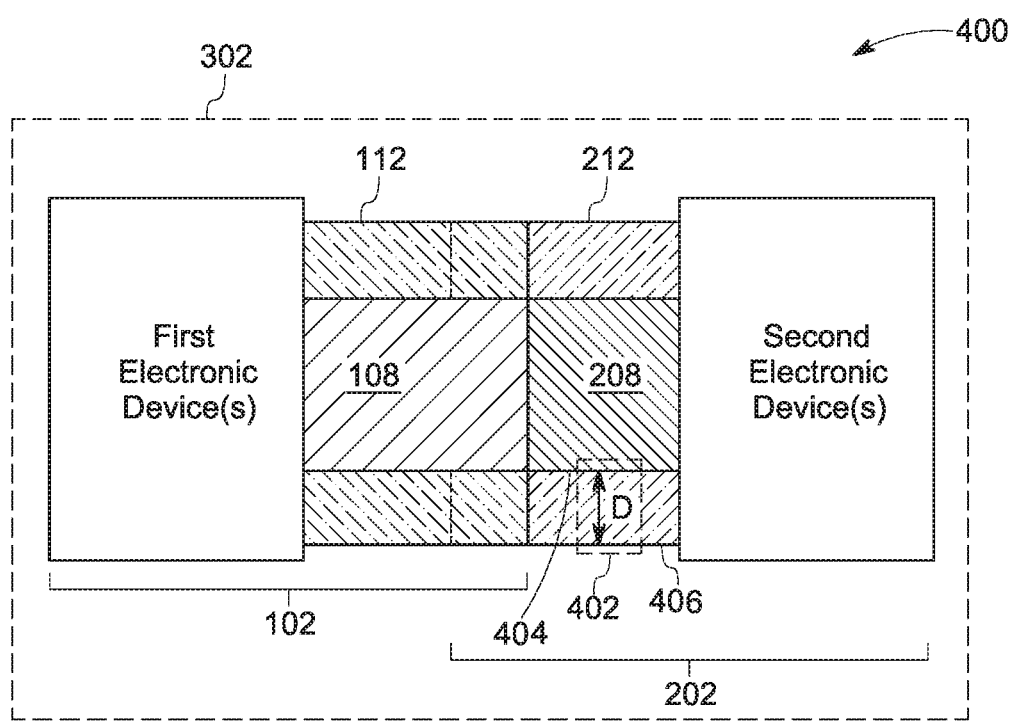
FIG. 4 is a diagrammatic representation of a top view of the electronic module assembly of FIG. 3, in accordance with aspects of the present specification.

FIG. 4 is a diagrammatic representation of a top view 400 of the electronic module assembly of FIG. 3. As previously noted, shorter lengths of the first and second electrically insulating plates 112 and 212 are used at terminal portions such as the first portions 114, 214 of the first and second buses 106, 206 to facilitate coupling of the buses 106, 206. However, at other portions of the first and second buses 106, 206, the first and second electrically insulating plates 112, 212 having greater size may be used. By way of example, in these portions, the corresponding areas of the first and second electrically insulating plates 112, 212 are larger than the areas of the respective electrically conductive plates.

As noted hereinabove, in certain portions of the first and second buses 106, 206, the area of the first and second electrically insulating plates 112, 212 may be greater than that of the electrically conducting plates 108, 110, 208, 210. In FIG. 4, "D" is generally representative of a distance by which the electrically insulating plate 212 extends beyond the electrically conductive plates 208, 210 Accordingly, in the example of FIG. 4, in the region 402, the creepage distance may be two times the distance "D." In particular, an electron traveling from the third electrically conductive plate 208 to the fourth electrically conductive plate 210 will need to traverse a distance of "2D" along a surface of the second insulating plate 212. More specifically, the electron will need to traverse the distance "D" from an edge 404 of the third electrically conductive plate 208 to an edge 406 of the second electrically insulating plate 212. Additionally, the electron will need to traverse the distance "D" from the edge 406 to an edge of the fourth electrically conductive plate 210, under the assumption that the edges of the third and fourth electrically conductive plates 208, 210 are aligned with each other. Use of first and second electrically insulating plates 112, 212 having a larger area aids in increasing the creepage distance between the respective electrically conductive plates. This increase in the creepage distance in turn results in a stronger electrical insulation between the respective electrically conductive plates.

Figure 5:
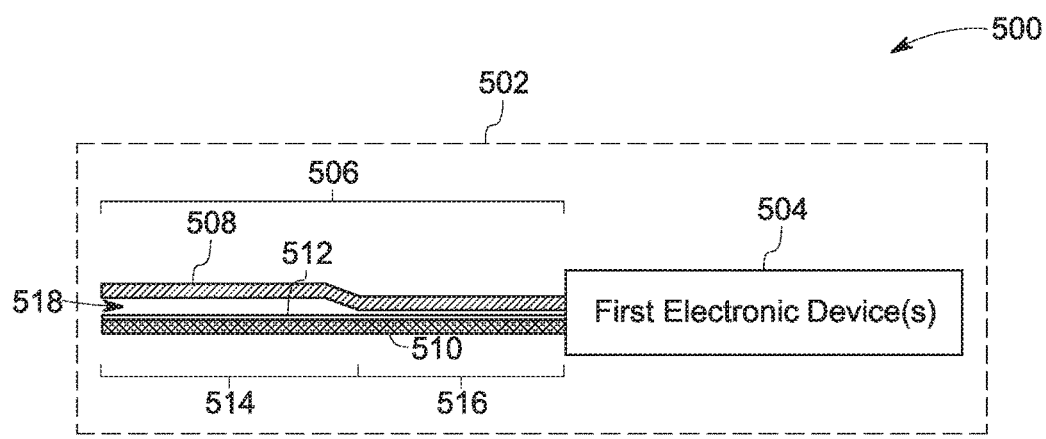
FIG. 5 is a diagrammatic representation of another embodiment of the electronic module of FIG. 1, in accordance with aspects of the present specification.

FIG. 5 is a diagrammatic representation 500 of another embodiment 502 of the first electronic module 102 of FIG. 1, in accordance with aspects of the present specification. The first electronic module 502 of FIG. 5 includes one or more first electronic devices 504 and a first bus 506 electrically coupled to at least one of the first electronic devices 504.

The first bus 506 includes a first electrically conductive plate 508, a second electrically conductive plate 510, and a first electrically insulating plate 512 disposed between the first and second electrically conductive plates 508, 510. The first bus 506 is depicted as having a first portion 514 and a second portion 516. In some embodiments, in the first portion 514, the first electrically insulating plate 512 may be disposed in direct physical contact with the second electrically conductive plate 510. However, in the first portion 514, the first electrically insulating plate 512 is not in direct physical contact with the first electrically conductive plate 508. Accordingly, in the embodiment of FIG. 5, the first portion 514 of the first bus 506 includes a single cavity 518 between the first electrically conductive plate 508 and the first electrically insulating plate 512. In some embodiments, the cavity 518 aids in operatively coupling the first electronic module 502 with another electronic module (see FIG. 6).

In another embodiment, in the first portion 514, the first electrically insulating plate 512 may be disposed in direct physical contact with the first electrically conductive plate 508.

Additionally, in this example, the first electrically insulating plate 512 may not be in direct physical contact with the second electrically conductive plate 510 in the first portion 514. Accordingly, in this embodiment, the first portion 514 of the first bus 506 includes a single cavity 518 between the second electrically conductive plate 510 and the first electrically insulating plate 512. Moreover, in some embodiments, in the second portion 516 of the first bus 506, the first electrically insulating plate 512 may be disposed in direct physical contact with at least one of the first electrically conductive plate 508 and the second electrically conductive plate 510.

Figure 6:
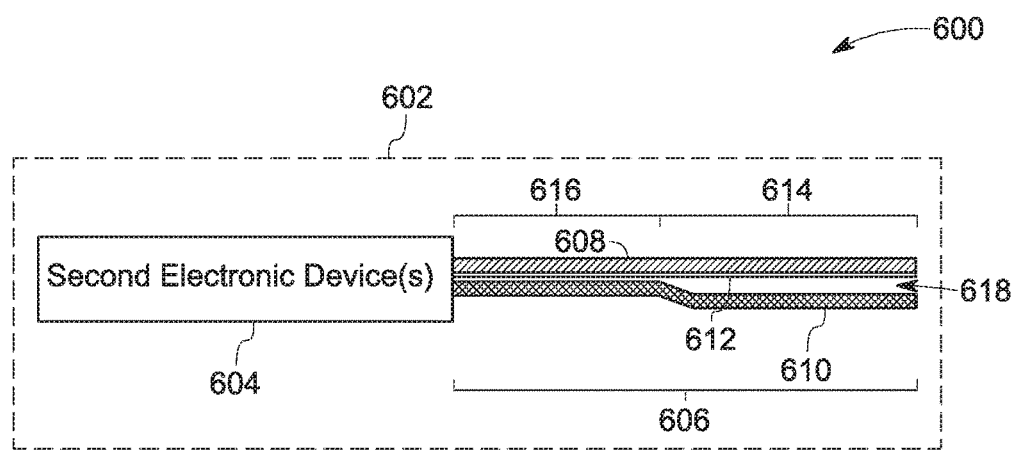
FIG. 6 is a diagrammatic representation of another embodiment of the electronic module of FIG. 2, in accordance with aspects of the present specification.

Turning now to FIG. 6, a diagrammatic representation 600 of another embodiment 602 of the second electronic module 202 of FIG. 2, in accordance with aspects of the present specification, is illustrated. The second electronic module 602 of FIG. 6 includes one or more second electronic devices 604 and a second bus 606 electrically coupled to at least one of the second electronic devices 604.

Figure 7:
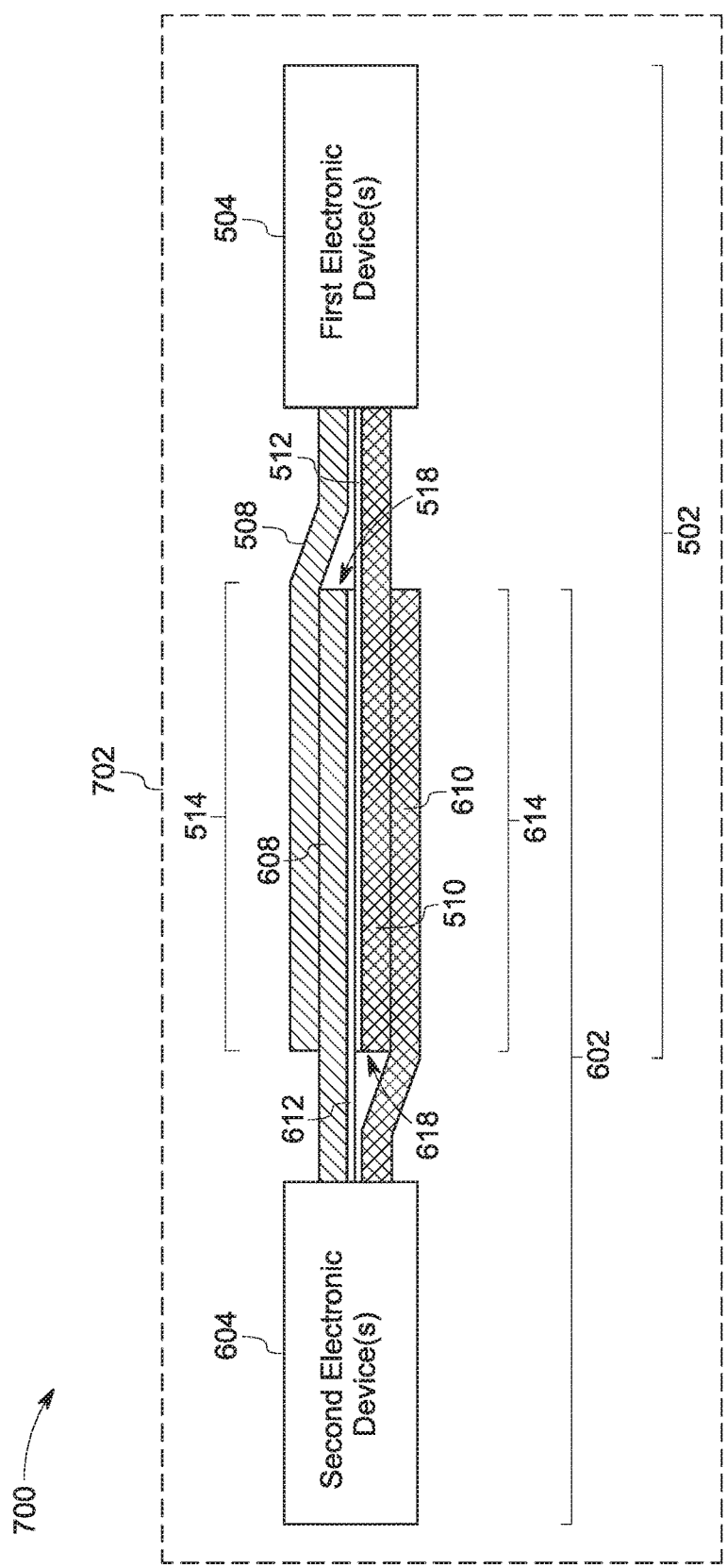
FIG. 7 is a diagrammatic representation of an electronic module assembly including the electronic modules of FIGS. 5 and 6, in accordance with aspects of the present specification.

The second bus 606 includes a third electrically conductive plate 608, a fourth electrically conductive plate 610, and a second electrically insulating plate 612 disposed between the third electrically conductive plate 608 and the fourth electrically conductive plate 610. The second bus 606 is depicted as having a first portion 614 and a second portion 616. In some embodiments, in the first portion 614, the second electrically insulating plate 612 may be disposed in direct physical contact with the third electrically conductive plate 608. However, in the example of FIG. 6, the second electrically insulating plate 612 is not in direct physical contact with the fourth electrically conductive plate 610 in the first portion 614. Accordingly, in the embodiment of FIG. 6, the first portion 614 of the second bus 606 includes a single cavity 618 between the second electrically insulating plate 612 and the fourth electrically conductive plate 610. Moreover, in the configuration of FIG. 6, a size of the cavity 618 is bigger than a size of the cavity 218 of FIG. 2. In some embodiments, the cavity 618 aids in operatively coupling the second electronic module 602 with the first electronic module 502 of FIG. 5, as shown in FIG. 7. Yet another embodiment of the second bus 606 where the first portion 614 including a single cavity between the third electrically conductive plate 608 and the second electrically insulating plate 612 is also contemplated.

Turning now to FIG. 7, a diagrammatic representation 700 of an electronic module assembly 702 is presented. More particularly, the electronic module assembly 702 is formed by assembling the first electronic module 502 of FIG. 5 and the second electronic module 602 of FIG. 6. Accordingly, the electronic module assembly 702 is described with reference to the components of FIGS. 5-6.

In the example of the electronic module assembly 702, the first and second electronic modules 502, 602 are operatively coupled such that a portion of the second bus 606 is disposed in the cavity 518 in the first portion 514 of the first bus 506.

More specifically, as depicted in FIG. 7, at least a portion of the third electrically conductive plate 608 and the second electrically insulating plate 612 is disposed in the cavity 518. Also, at least a portion of the second electrically conductive plate 510 and the first electrically insulating plate 512 are disposed in the cavity 618 of the second bus 606.

The second bus 606 may be interconnected with the first bus 506 such that the second electrically insulating plate 612 overlaps with the first electrically insulating plate 512. Such an overlap between the electrically insulating plates 512, 612 aids in electrically insulating the first and third electrically conductive plates 508, 608 from the second and fourth electrically conductive plates 510, 610. Moreover, the first electrically conductive plate 508 is electrically coupled to the third electrically conductive plate 608. Additionally, the second electrically conductive plate 510 is electrically coupled to the fourth electrically conductive plate 610.

In some embodiments, the first portions 514 and/or 614 having determined lengths are selected such that the overlap region therebetween is capable of withstanding an ampacity of the electronic module assembly 702. Selecting the dimensions of the first portion 514 of the bus 506 and/or the first portion 614 of the second bus 606 as described hereinabove aids in reducing the inductance of an interconnection/coupling between the electronic modules 502, 602. This reduction in the inductance of the interconnection between the electronic modules 502, 602 in turn aids in reducing the loop inductance of the electronic module assembly 702.

Figure 8:
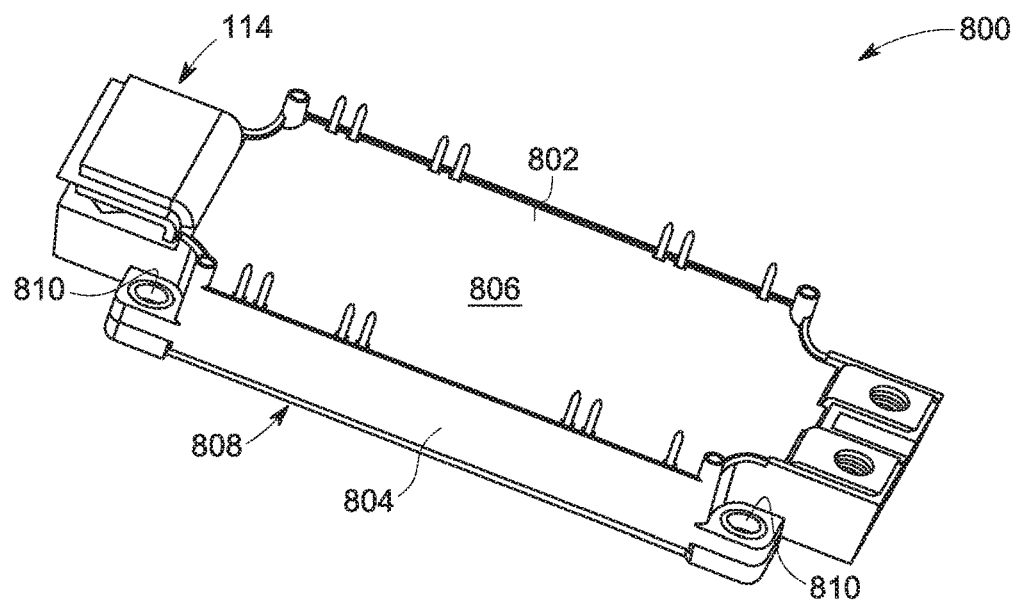
FIG. 8 is a diagrammatic representation of an electronic module package, in accordance with aspects of the present specification.

FIG. 8 is a perspective view of an electronic module package 800, in accordance with aspects of the present specification. Also, FIG. 8 is described in conjunction with FIG. 1. The electronic module package 800 may include a housing 802. In some embodiments, the housing 802 may include a frame 804, a top enclosure plate 806, and a bottom enclosure plate 808. The top enclosure plate 806 and the bottom enclosure plate 808 may be disposed on the frame 804 to create the housing 802. The housing 802 may be used to enclose an electronic module such as the first or second electronic modules 102, 202. In one example, the housing 802 may enclose the first electronic module 102. More particularly, in the example of FIG. 8, the housing 802 is configured to enclose one or more of first electronic devices 104 and at least a portion of the first bus 106. Moreover, the housing 802 may be disposed such that another portion of the first bus 106, such as the first portion 114 protrudes outside the housing 802. This protruding first portion 114 of the first bus 106 may be used to facilitate coupling of the electronic module package 800 with other electronic modules such as the second electronic module 202 of FIG. 2.

The housing 802 may further include one or more mounting provisions 810. The mounting provisions 810 may be used for mounting the electronic module package 800 on a support structure. The support structure may include, but is not limited to, a circuit board, a heat sink, or a combination thereof. In one non-limiting example, the housing 802 may include four mounting provisions 810.

In certain embodiments, another electronic module package may include the second electronic module 202. It may be desirable to effect a coupling of the electronic module packages by operatively coupling the first and second electronic modules 102, 202 that are housed within respective electronic module packages. Some example configurations that are employed to facilitate the coupling between two electronic modules are presented in FIGS. 9-12. More particularly, the configurations of FIGS. 9-12 that are employed for coupling two electronic modules aid in creating pressure on the electrically conductive plates to securely interconnect the electronic modules. This secure interconnection facilitates minimization of any displacement of the electronic modules.

Figure 9:
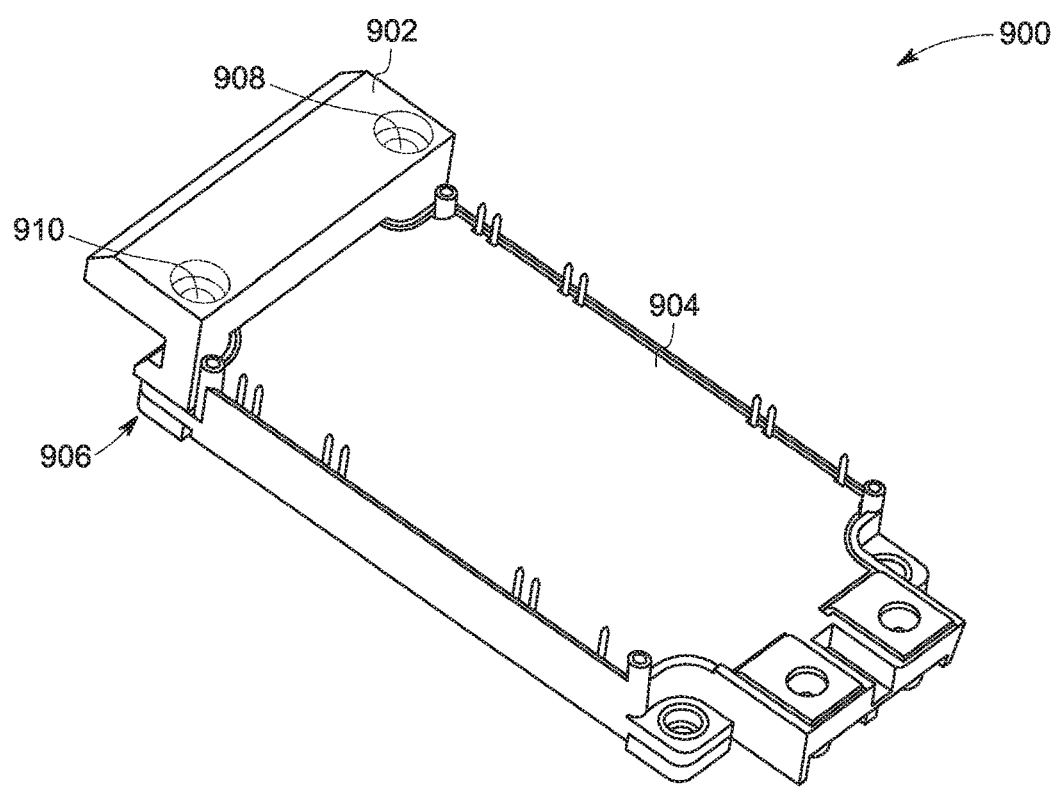
FIG. 9 is a diagrammatic representation of an electronic module package with a mounting apparatus, in accordance with aspects of the present specification.

Referring now to FIG. 9, a perspective view of an electronic module package 900 having a mounting apparatus 902, in accordance with aspects of the present specification, is depicted. The electronic module package 900 may be representative of one embodiment of the electronic module package 800 of FIG. 8. Some non-limiting examples of materials used to form the mounting apparatus 902 may include electrically insulating materials such as plastic, rubber, mica, glastic, PET, PTFE, glass fiber compounds, or combinations thereof.

In some embodiments, the electronic module package 900 may include the mounding apparatus 902 and a housing 904. The housing 904 is configured to enclose an electronic device module (not shown). Further, the mounting apparatus 902 may be operatively coupled to the housing 904 at a first portion 906 of a bus. This first portion 906 may be similar to the first portion 114 of the first bus 106 of FIG. 1. The mounting apparatus 902 may be operatively coupled to the housing 904 via use of fastening mechanisms, such as, but not limited to, an adhesive, one or more fasteners, or a combination thereof. In one example, a fastener such as a screw may be disposed in at least one hole 908, 910 to secure the mounting apparatus 902 to the housing 904. In some embodiments, the mounting apparatus 902 may be an integral part of the housing 904.

Further, in certain embodiments, the electronic module package 900 may be operatively coupled to another electronic module package to form an exemplary electronic module assembly. More particularly, a bus of the other electronic module package may be inserted into the first portion 906 of the bus of the electronic module package 900 to form the exemplary electronic module assembly. In such a configuration of the electronic module assembly, the mounting apparatus 902 may be configured to exert a pressure on the first portion 906 of the bus of electronic module package 900 via use of the mounting apparatus 902 to securely couple the two electronic modules, while minimizing any displacement of the bus of the other electronic module. The mounting apparatus 902 will be described in greater detail with respect to FIG. 10.

Figure 10:
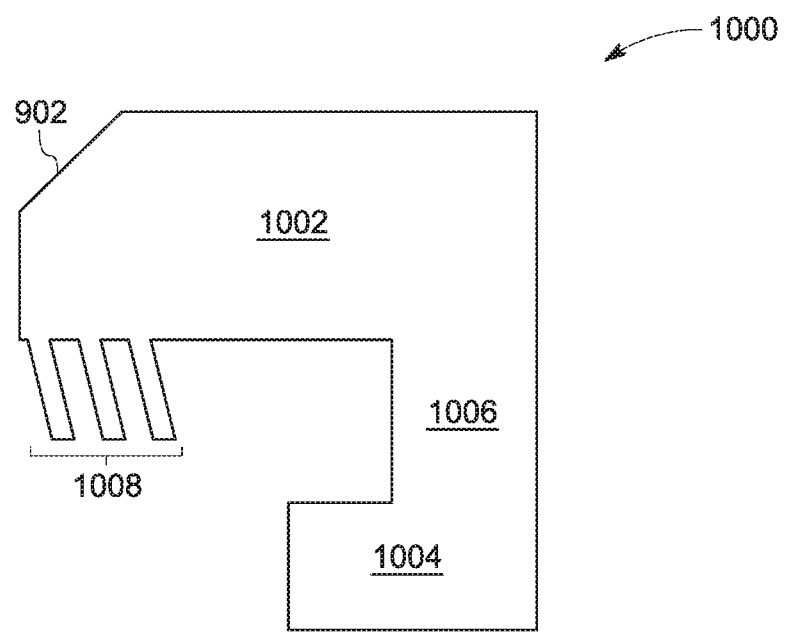
FIG. 10 is a cross-sectional view of the mounting apparatus of FIG. 9, in accordance with aspects of the present specification.

Turning to FIG. 10, a cross-sectional view 1000 of the mounting apparatus 902 of FIG. 9 is depicted. As illustrated in FIG. 10, the mounting apparatus 1000 has a J-shaped structure. In one embodiment, the J-shaped structure of the mounting apparatus 1000 has two horizontal sections 1002, 1004, and a vertical section 1006 disposed between the two horizontal sections 1002 and 1004. Moreover, the mounting apparatus 1000 includes one or more flexible protrusions 1008 that extend toward a bus of the electronic module package 900 (see FIG. 9). In some embodiments, the flexible protrusions 1008 are configured to exert pressure on a first portion of a first bus of an electronic module assembly. In the embodiment of FIG. 10, for ease of illustration, the mounting apparatus 1000 is depicted as having three flexible protrusions 1008. It may be noted that the mounting apparatus 1000 having greater or lower number of flexible protrusions 1008 is also contemplated.

Figure 11:
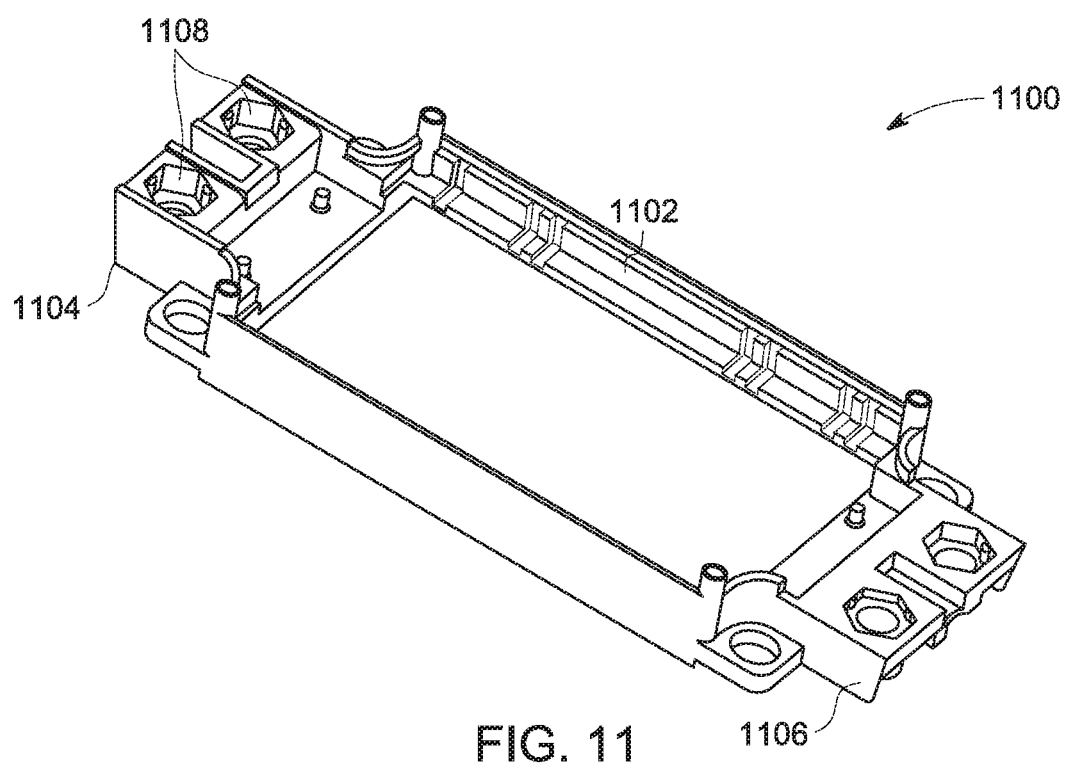
FIG. 11 is a perspective view of a frame of a body for the electronic module package of FIG. 8, in accordance with aspects of the present specification.

FIG. 11 is a perspective view 1100 of a frame 1102 of an electronic module package, such as the electronic module package 800 of FIG. 8. Also, FIG. 11 is described with reference to the components of FIG. 1. As depicted in FIG. 11, the frame 1102 has a first end 1104 and a second end 1106. In one embodiment, the frame 1102 may include one or more slots 1108 at the first end 1104. Further, in some embodiments, an elastic member (not shown) may be disposed in one or more of the slots 1108. Non-limiting examples of the elastic member include a spring, a rubber element, or combinations thereof. The spring may be formed of an electrically conductive material, an electrically insulating material, or a combination thereof. The elastic member may be disposed such that while one end of the elastic member is inserted into the slot 1108, the other end of the elastic member may be supported by the first portion 114 of the first bus 106. In such a configuration, the elastic member is configured to exert a pressure on the first portion 114 of the first bus 106. Therefore, when a portion of a bus of another electronic module is disposed within the first portion 114, the pressure applied on the first portion 114 via the elastic member aids in securely coupling the two electronic modules, while minimizing the displacement of the bus of the other electronic module.

Figure 12:
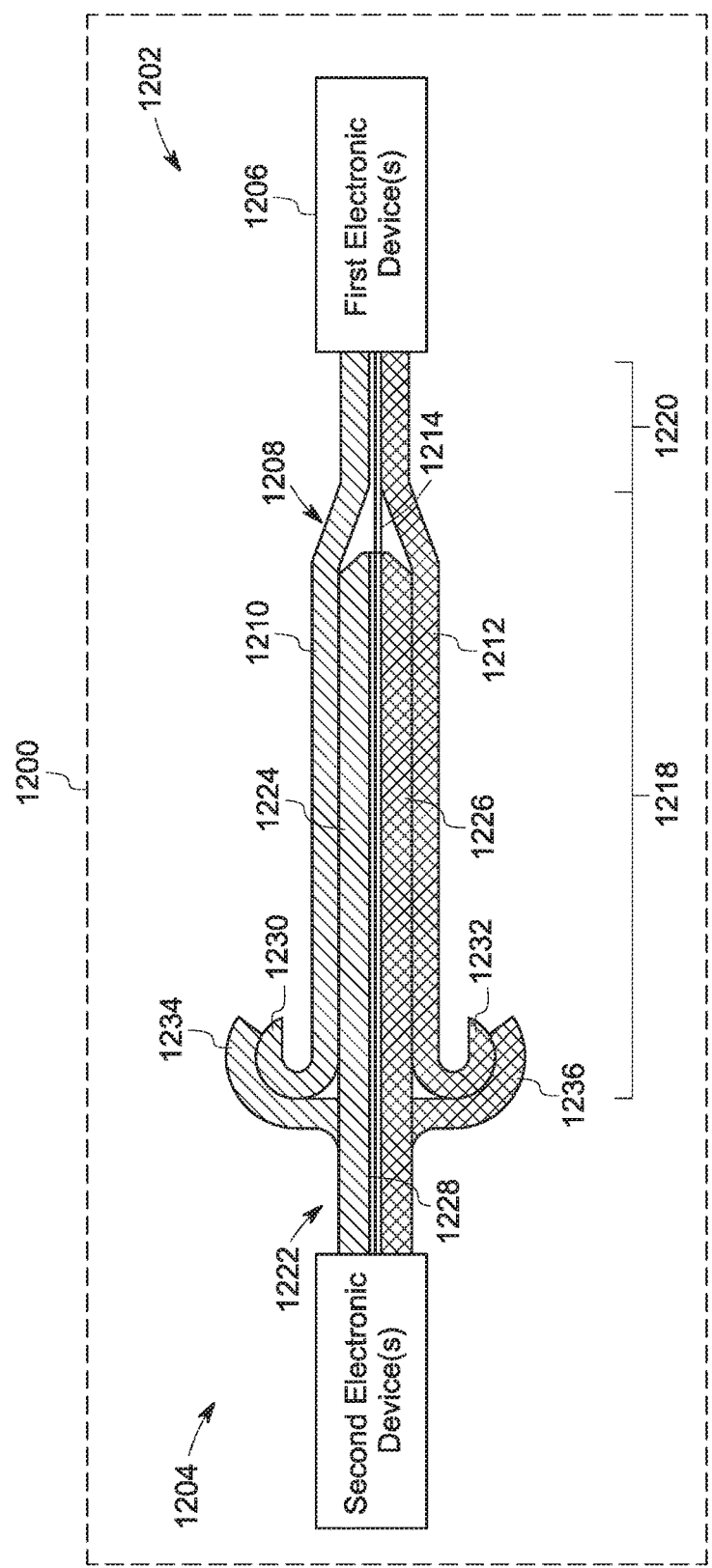
FIG. 12 is a diagrammatic representation of another electronic module assembly, in accordance with aspects of the present specification.

FIG. 12 is a diagrammatic representation of an electronic module assembly 1200, in accordance with aspects of the present specification. The electronic module assembly 1200 includes a first electronic module 1202 and a second electronic module 1204.

The first electronic module 1202 may include one or more first electronic devices 1206 that are electrically coupled to a first bus 1208, such as a DC bus. The first bus 1208 may include a first electrically conductive plate 1210, a second electrically conductive plate 1212, and a first electrically insulating plate 1214 disposed therebetween. Also, the first bus 1208 is indicated as having a first portion 1218 and a second portion 1220.

The second electronic module 1204 may include one or more second electronic devices 1220 that are electrically coupled to a second bus 1222, such as a DC bus. The second bus 1222 may include a third electrically conductive plate 1224, a fourth electrically conductive plate 1226, and a second electrically insulating plate 1228 disposed therebetween.

The configuration of the first electronic module 1202 is substantially similar to that of the electronic module 102 of FIG. 1. However, in the embodiment of FIG. 12, in the first portion 1214 of the first bus 1208, one or both of the first electrically conductive plate 1210 and the second electrically conductive plate 1212 may be rolled at a terminal section. Reference numerals 1230 and 1232 respectively represent rolled portions of the first electrically conductive plate 1210 and the second electrically conductive plate 1212. In the embodiment of FIG. 12, the first and second electrically conductive plates 1210, 1212 are depicted as being rolled in an outward manner. Certain other embodiments where the ends of the first electrically conductive plate 1210 and/or the second electrically conductive plate 1212 are folded, bent, wrapped, crimped, or wrinkled, are also envisioned.

In FIG. 12, the first electronic module 1202 is operatively coupled to the second electronic module 1204. More particularly, the second bus 1222 of the second electronic module 1204 may be inserted into the first portion 1218 of the first bus 1208 of the first electronic module 1202 to form the exemplary electronic module assembly 1200. In the electronic module assembly 1200, the rolled portions 1230, 1232 of the first and second electrically conductive plates 1210, 1212 may be configured to exert a pressure on the first portion 1218 of the first bus 1208. This pressure aids in securely coupling the first and second buses 1208, 1222, while also minimizing any displacement of the second bus 1222 of the second electronic module 1204 when the second electronic module 1204 is operatively coupled to the first electronic module 1202. In some embodiments, the second bus 1222 of the second electronic module 1204 may include support provisions 1234, 1236 configured to provide mechanical support to the rolled portions 1230, 1232. In some other embodiments, the support provisions 1234, 1236 may be a part of a housing such as the housing 802 in which the electronic module assembly 1200 may be disposed. In certain embodiments, the support provisions 1234, 1236 may be attached to the housing. The support provisions 1234, 1236 may be formed using one or more electrically conductive materials, one or more electrically insulating materials, or a combination thereof. Implementing the electronic module assembly 1200 as described hereinabove allows the bus 1208 of one electronic module 1202 to circumvent or minimize any displacement of the bus 1222 of another electronic module 1204 when the two electronic modules 1202, 1204 are operatively coupled to one another.

Figure 13:
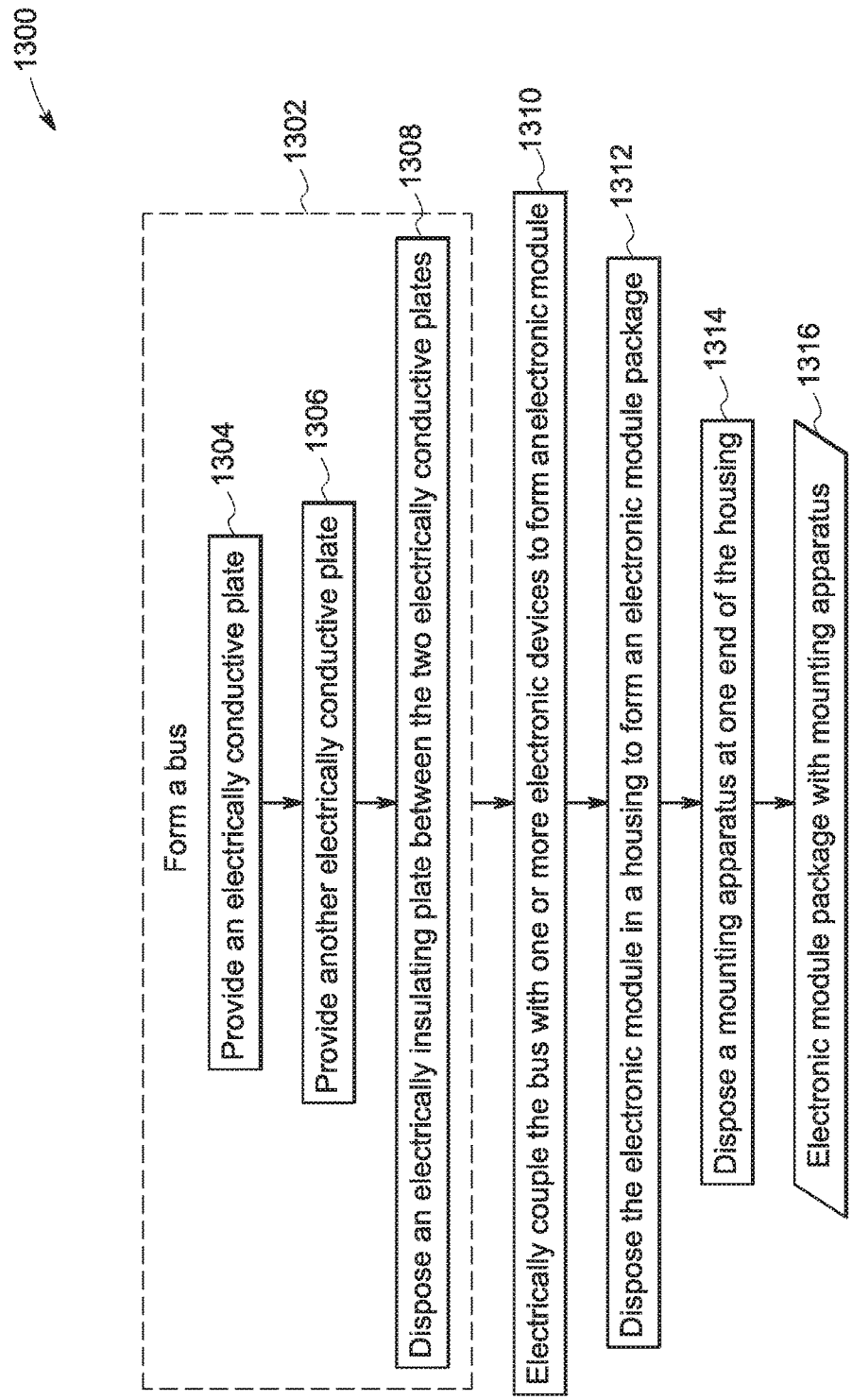
FIG. 13 is a flow diagram of an example method for manufacturing an electronic module package that includes the electronic module of FIG. 1 or the electronic module of FIG. 2, in accordance with aspects of the present specification.

FIG. 13 is a flow diagram 1300 of an example method for manufacturing an electronic module package, such as the electronic module package 900 of FIG. 9. The electronic module package 900 may include the first electronic module 102 of FIG. 1 or the second electronic module 202 of FIG. 2, in accordance with aspects of the present specification. The flow diagram 1300 is described in conjunction with the components of FIGS. 1, 2, 5, 6, 8, and 9.

The method includes forming a bus, as indicated by step 1302. In some embodiments, a bus such as the first buses 106, 506 or the second buses 206, 606 may be formed. For ease of explanation, the first bus 106 may be formed at step 1302. Also, in certain embodiments, step 1302 may include steps 1304, 1306, and 1308.

At step 1304, an electrically conductive plate such as the first electrically conductive plate 108 may be provided. In one example, the first electrically conductive plate 108 may have a rectangular shape.

Further, at step 1306, another electrically conductive plate such as the second electrically conductive plate 110 may be provided. In one example, the second electrically conductive plate 110 may have a rectangular shape.

Subsequently, at step 1308, an electrically insulating plate may be disposed between the two electrically conductive plates to form the bus. In some embodiments, the electrically insulating plate such as the first electrically insulating plate 112 may be disposed between the first electrically conductive plate 108 and the second electrically conductive plate 110 to form the first bus 106. Furthermore, in the first portion 114 of the first bus 106, the first electrically insulating plate 112 is disposed such that the first electrically insulating plate 112 is not in direct physical contact with the first electrically conductive plate 108 and the second electrically conductive plate 110. Additionally, in some embodiments, in the second portion 116 of the first bus 106, the first electrically insulating plate 112 may be disposed such that the first electrically insulating plate 112 is disposed in direct physical contact with at least one of the first electrically conductive plate 108 and the second electrically conductive plate 110. In certain other embodiments, in the second portion 116 of the first bus 106, the first electrically insulating plate 112 may be disposed such that the first electrically insulating plate 112 is not in direct physical contact with at least one of the first electrically conductive plate 108 and the second electrically conductive plate 110. Consequent to the processing of steps 1304-1308, the first bus 106 may be formed.

It may be noted that the second bus 206 may also be formed using steps 1304-1308. Accordingly, in this example, an electrically insulating plate such as the second electrically insulating plate 212 may be disposed between the third and fourth electrically conductive plates 208, 210 to form the second bus 206. In one example, the second electrically insulating plate 212 may be positioned such that second electrically insulating plate 212 is disposed in direct physical contact with one of the third electrically conductive plate 208 and the fourth electrically conductive plate 210 to form the second bus 206. Consequent to the processing of steps 1304-1308, the second bus 206 may be formed.

Moreover, at step 1310, the bus may be electrically coupled to one or more electronic devices to form an electronic module. In some embodiments, the first bus 106 may be electrically coupled to the first electronic devices 104 to form the first electronic module 102. The first bus 106 may be electrically coupled to the first electronic devices 104 via use of soldering, brazing, ultrasonic wire bonding, sintering, or combinations thereof. Moreover, the first electronic module 102 that is operatively coupled to the first electronic device(s) 104 may generally be referred to as a first electronic module (see FIG. 1).

In a similar fashion, in some embodiments, the second bus 206 may also be electrically coupled to one or more second electronic devices 204 to form the second electronic module 202. Further, the second bus 206 may also be electrically coupled to the second electronic devices 204 via use of soldering, brazing, ultrasonic wire bond, sintering, cabling, or combinations thereof. The second electronic module 202 that is operatively coupled to the second electronic device(s) 204 may generally be referred to as a second electronic module (see FIG. 2). Furthermore, at step 1312, the electronic module formed at step 1310 may be disposed in a housing to form an electronic module package. For example, at step 1312, the first electronic module 102 is disposed in a corresponding housing, such as the housing 802 of FIG. 8 to form the electronic module package. Similarly, the second electronic module 202 may also be disposed in a corresponding housing to form another electronic module package.

Additionally, in some embodiments, a mounting apparatus such as the mounting apparatus 902 of FIG. 9 may be disposed at one end of the housing, as depicted by step 1314. In one example, the mounting apparatus 902 may be disposed about the first portion 114 of the first bus 106. Consequent to the processing of steps 1302-1314, an exemplary electronic module package 1316 such as the electronic module package 900 (see FIG. 9) having a mounting apparatus 902 is formed.

Figure 14:
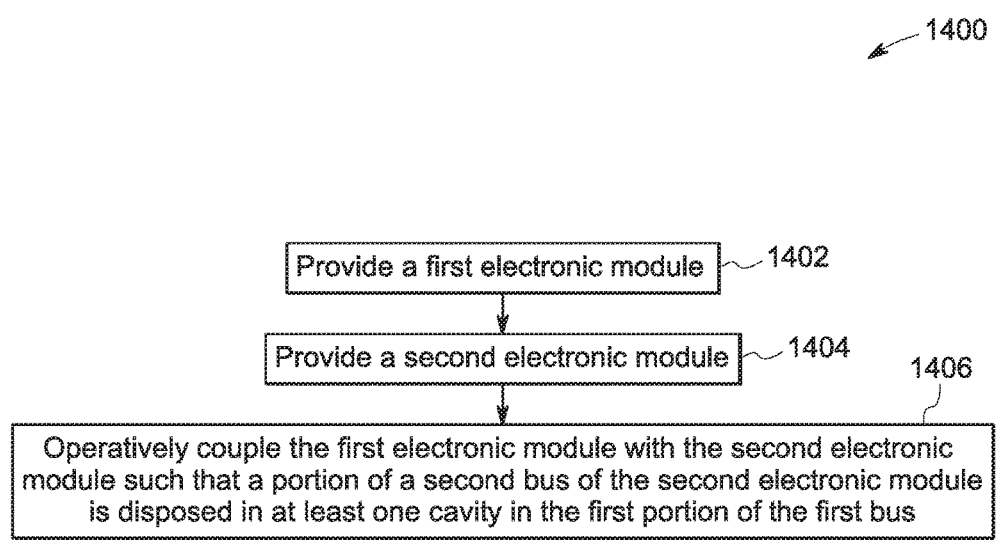
FIG. 14 is a flow diagram of an example method for manufacturing an electronic module assembly, in accordance with aspects of the present specification.

Referring to FIG. 14, a flow diagram 1400 of an example method for forming an electronic module assembly such as the electronic module assembly 302 of FIG. 3, in accordance with aspects of the present specification, is depicted. The flow diagram 1400 is described in conjunction with the components of FIGS. 1, 2, and 3.

At step 1402, an electronic module such as the first electronic module 102 may be provided. Also, step 1404, another electronic module such as the second electronic module 202 may be provided. As previously noted, the first and second electronic modules 102, 202 may be formed using the method of FIG. 13, in one example. Further, as previously noted, the first electronic module 102 includes the first and second electrically conductive plates 108, 110 and the first electrically insulating plate 112 disposed therebetween. In some embodiments, in the first portion 114 of the first bus 106, the first electrically insulating plate 112 is disposed in an arrangement such that the first electrically insulating plate 112 is not in direct physical contact with at least one of the first electrically conductive plate 108 and the second electrically conductive plate 110. In the embodiment of FIG. 1, in the first portion 114 of the first bus 106, the first electrically insulating plate 112 is disposed in an arrangement such that the first electrically insulating plate 112 is not in direct physical contact with both the first and second electrically conductive plates 108, 110. Moreover, in some embodiments, in the second portion 116 of the first bus 106, the first electrically insulating plate 112 is disposed in direct physical contact with at least one of the first electrically conductive plate 108 and second electrically conductive plate 110. However, in some other embodiments, in the second portion 116 of the first bus 106, the first electrically insulating plate 112 is disposed such that the first electrically insulating plate 112 is not in direct physical contact with the first electrically conductive plate 108 and second electrically conductive plate 110.

As previously noted, the second electronic module 202 includes the second bus 206 that is electrically coupled to the second electronic device(s) 204. The second bus 206 includes the third and fourth electrically conductive plates 208, 210 and a second electrically insulating plate 212 disposed therebetween. In particular, the second electrically insulating plate 212 is disposed in direct physical contact with at least one of the third electrically conductive plate 208 and the fourth electrically conductive plate 210.

Furthermore, at step 1406, the first electronic module 102 is operatively coupled to the second electronic module 202 to form the electronic module assembly 302. In some embodiments, the first electronic module 102 is coupled to the second electronic module 202 such that a portion of the second bus 206 is disposed in at least one cavity 118, 120 in the first portion 114 of the first bus 106. More particularly, the portion of the second bus 206 is disposed such that the first electrically insulating plate 112 physically overlaps at least a portion of the second electrically insulating plate 212. In addition, the first electrically conductive plate 108 is electrically coupled to the third electrically conductive plate 208. Also, the second electrically conductive plate 110 is electrically coupled to the fourth electrically conductive plate 210.

Consequent to the processing of steps 1402-1408, the electronic module assembly 302 having an overall lower value of loop inductance is formed. Additionally, since the electrically insulating plates 112, 212 overlap one another, the creepage distance and/or the strike distance corresponding to the overlap region 304 may be enhanced. Furthermore, the overlapping electrically insulating plates 112, 212 also provide desired electrical insulation between the electrically conductive plates 108, 208 and the electrically conductive plates 110, 210.

Any of the foregoing steps may be suitably replaced, reordered, or removed, and additional steps may be inserted, depending on the needs of a particular application.

The various configurations of the first and second electronic modules and the methods of making the same presented hereinabove aid in forming an electronic module assembly having an overall lower loop inductance. Use of the exemplary electronic module assemblies that have a lower value of the overall loop inductances advantageously allows these assemblies to be employed in applications that demand high speed switching. Moreover, the mounting structure aids in facilitating tight coupling between two electronic modules.

It will be appreciated that variants of the above disclosed and other features and functions, or alternatives thereof, may be combined to create many other different applications. Various unanticipated alternatives, modifications, variations, or improvements therein may be subsequently made by those skilled in the art and are also intended to be encompassed by the following claims.

The invention claimed is:

1. An electronic module, comprising:
   one or more electronic devices;
   a first bus electrically coupled to at least one of the one or more electronic devices, wherein the first bus comprises:
      a first electrically conductive plate;
      a second electrically conductive plate; and
      a first electrically insulating plate disposed between the first electrically conductive plate and the second electrically conductive plate,
   wherein, in a first portion of the first bus, the first electrically insulating plate is disposed such that the first electrically insulating plate is not in direct physical contact with at least one of the first electrically conductive plate and the second electrically conductive plate to form at least one cavity between the first electrically insulating plate and at least one of the first electrically conductive plate and the second electrically conductive plate, and
   wherein the first portion of the first bus is configured to be couplable to a second bus associated with a second electronic module such that a portion of the second bus is disposed in the at least one cavity.

2. The electronic module of claim 1, wherein the second bus comprises:
   a third electrically conductive plate;
   a fourth electrically conductive plate; and
   a second electrically insulating plate disposed between the third electrically conductive plate and the fourth electrically conductive plate.

3. The electronic module of claim 1, wherein, in a second portion of the first bus, the first electrically insulating plate is disposed in direct physical contact with at least one of the first electrically conductive plate and the second electrically conductive plate.

4. The electronic module of claim 1, wherein, in a second portion of the first bus, the first electrically insulating plate is disposed such that the first electrically insulating plate is not in direct physical contact with the first electrically conductive plate and the second electrically conductive plate.

5. The electronic module of claim 1, wherein the electronic module is a semiconductor switching unit, a power supply unit, or a combination thereof.

6. The electronic module of claim 1, wherein the first electrically conductive plate is maintained at a first potential and the second electrically conductive plate is maintained at a second potential, and wherein the second potential is different from the first potential.

7. The electronic module of claim 1, wherein, in the first portion of the first bus, a length of the first electrically insulating plate is lesser than or equal to a length of at least one of the first electrically conductive plate and the second electrically conductive plate.

8. The electronic module of claim 1, wherein, in the first portion of the first bus, a terminal section of one or both of the first electrically conductive plate and the second electrically conductive plate are rolled.

9. The electronic module of claim 1, further comprising a housing configured to enclose the one or more electronic devices and at least a portion of the first bus.

10. The electronic module of claim 9, further comprising a mounting apparatus configured to exert a pressure on the first portion of the first bus.

11. The electronic module of claim 10, wherein the mounting apparatus is operatively coupled to the housing via an adhesive, one or more fasteners, or a combination thereof.

12. The electronic module of claim 10, wherein the mounting apparatus comprises one or more flexible protrusions extending toward the first bus and configured to exert the pressure on the first portion of the first bus.

13. The electronic module of claim 10, wherein the mounting apparatus further comprises at least one elastic member, and wherein the elastic member is configured to exert the pressure on the first portion of the first bus.

14. An electronic module assembly, comprising:
a first electronic module comprising:
one or more first electronic devices;
a first bus electrically coupled to at least one of the one or more first electronic devices, wherein the first bus comprises a first electrically conductive plate, a second electrically conductive plate, and a first electrically insulating plate disposed between the first electrically conductive plate and the second electrically conductive plate,
wherein in a first portion of the first bus, the first electrically insulating plate is disposed such that the first electrically insulating plate is not in direct physical contact with at least one of the first electrically conductive plate and the second electrically conductive plate to form at least one cavity between the first electrically insulating plate and at least one of the first electrically conductive plate and the second electrically conductive plate;
a second electronic module comprising:
one or more second electronic devices; and
a second bus electrically coupled to at least one of the one or more second electronic devices and comprising a third electrically conductive plate, a fourth electrically conductive plate, and a second electrically insulating plate disposed between the third electrically conductive plate and the fourth electrically conductive plate,
wherein the first electronic module is electrically coupled to the second electronic module such that a portion of the second bus is disposed in the at least one cavity in the first portion of the first bus.

15. The electronic module assembly of claim 14, wherein the first electronic module is a power supply unit and the second electronic module comprises one or more semiconductor switches.

16. The electronic module assembly of claim 15, wherein the one or more semiconductor switches comprise a gallium nitride based switch, a silicon carbide based switch, a gallium arsenide based switch, or combinations thereof.

17. The electronic module assembly of claim 14, wherein the portion of the second bus is disposed in the at least one cavity such that:
the first electrically insulating plate physically overlaps the second electrically insulating plate;
the first electrically conductive plate is electrically coupled to the third electrically conductive plate; and
the second electrically conductive plate is electrically coupled to the fourth electrically conductive plate.

18. The electronic module assembly of claim 14, further comprising a mounting apparatus disposed on at least one of the first electronic module and the second electronic module and configured to exert a pressure on the first portion of the first bus.

19. The electronic module assembly of claim 18, wherein the mounting apparatus comprises one or more flexible protrusions extending toward the first portion of the first bus and configured to exert the pressure on the first portion of the first bus.

20. A method for manufacturing an electronic module assembly, comprising:
providing a first electronic module, wherein the first electronic module comprises:
one or more electronic devices;
a first bus electrically coupled to at least one of the one or more electronic devices, wherein forming the first bus comprises:
a first electrically conductive plate;
a second electrically conductive plate;
a first electrically insulating plate disposed between the first electrically conductive plate and the second electrically conductive plate,
wherein in a first portion of the first bus, the first electrically insulating plate is disposed such that the first electrically insulating plate is not in direct physical contact with at least one of the first electrically conductive plate and the second electrically conductive plate to form at least one cavity between the first electrically insulating plate and at least one of the first electrically conductive plate and the second electrically conductive plate;
providing a second electronic module, wherein the second electronic module comprises:
one or more second electronic devices;
a second bus electrically coupled to at least one of the one or more second electronic devices and comprising a third electrically conductive plate, a fourth electrically conductive plate, and a second electrically insulating plate disposed between the third electrically conductive plate and the fourth electrically conductive plate; and
operatively coupling the first electronic module with the second electronic module such that a portion of the second bus is disposed in the at least one cavity in the first portion of the first bus to form the electronic module assembly.

* * * * *